United States Patent
Tsuboi et al.

(10) Patent No.: US 9,036,022 B2
(45) Date of Patent: May 19, 2015

(54) COMPONENT MOUNTING APPARATUS, ILLUMINATING APPARATUS USED IN IMAGING AND ILLUMINATING METHOD

(75) Inventors: Yasutaka Tsuboi, Yamanashi (JP); Toshihiko Tsujikawa, Yamanashi (JP); Ken Ishimatsu, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 411 days.

(21) Appl. No.: 13/516,843

(22) PCT Filed: Aug. 4, 2011

(86) PCT No.: PCT/JP2011/004430
§ 371 (c)(1),
(2), (4) Date: Jun. 18, 2012

(87) PCT Pub. No.: WO2012/026073
PCT Pub. Date: Mar. 1, 2012

(65) Prior Publication Data
US 2012/0257043 A1 Oct. 11, 2012

(30) Foreign Application Priority Data
Aug. 26, 2010 (JP) .................. 2010-189007

(51) Int. Cl.
*H04N 9/47* (2006.01)
*H04N 7/18* (2006.01)
*G03B 15/02* (2006.01)
*H05K 13/04* (2006.01)

(52) U.S. Cl.
CPC .................. *H05K 13/0413* (2013.01)

(58) Field of Classification Search
CPC ................................ H05K 13/0413
USPC .................................. 348/41–161
See application file for complete search history.

(56) References Cited

U.S. PATENT DOCUMENTS 6,584,283 B2 * 6/2003 Gabello et al. ............... 396/109
7,664,311 B2 * 2/2010 Yamasaki et al. ............. 382/150
(Continued)

FOREIGN PATENT DOCUMENTS

JP 10-208017 A 8/1998
JP 11-040983 A 2/1999
(Continued)

OTHER PUBLICATIONS

International Search Report for PCT/JP2011/004430 dated Sep. 13, 2011.

*Primary Examiner* — Joseph Ustaris
*Assistant Examiner* — Talha Nawaz
(74) *Attorney, Agent, or Firm* — Pearne & Gordon LLP (57) ABSTRACT

A component mounting apparatus, an illuminating apparatus used in imaging in the component mounting apparatus and an illuminating method are provided which can support various recognition objects and can meet the requirement of downsizing by reducing the occupied space. In the component mounting apparatus which performs an operation for mounting a component on a board (3), when illumination light is irradiated to the board (3) at the time of imaging with a board recognition camera (12), and when the illumination light is irradiated from a light emitting panel (15) which is formed by laminating a light source portion (13) and a color liquid crystal panel (14) and in which a plurality of light emitting portions whose light emission states can be individually changed are orderly arranged, the irradiation range of the illumination light which is irradiated from the respective light emitting portions are made to be changed on the basis of the imaging object. Therefore, while the imaging can be made on conditions suitably corresponding to various recognition objects, the requirement of downsizing can be met by reducing the occupied space of an illuminating portion (20).

6 Claims, 7 Drawing Sheets

(56) References Cited

U.S. PATENT DOCUMENTS

| | | | |
|---|---|---|---|
| 8,595,918 B2 * | 12/2013 | Jindo et al. | 29/709 |
| 2010/0118508 A1 * | 5/2010 | Okada et al. | 362/3 |

FOREIGN PATENT DOCUMENTS

| JP | 11-218408 A | 8/1999 |
|---|---|---|
| JP | 2000-180119 A | 6/2000 |
| JP | 2003-046297 A | 2/2003 |
| JP | 2008-078399 A | 4/2008 |
| JP | 2008-203237 A | 9/2008 |
| JP | 2008-205226 A | 9/2008 |
| JP | 2009-128303 A | 6/2009 |
| JP | 2009-128345 A | 6/2009 |
| JP | 2009-182280 A | 8/2009 |

\* cited by examiner

COMPONENT MOUNTING APPARATUS, ILLUMINATING APPARATUS USED IN IMAGING AND ILLUMINATING METHOD

TECHNICAL FIELD

The present invention relates to a component mounting apparatus which performs a component mounting operation for mounting a component on a board, an illuminating apparatus used in imaging which is used when a recognition object in the component mounting apparatus is imaged and an illuminating method.

BACKGROUND ART

In a component mounting apparatus which performs an operation for mounting components such as a component loading apparatus used in a component mounting line, for the purpose of board identification, position sensing or inspection of mounting states, a recognition object such as the component mounted on a board or a recognition mark provided on the surface of the board and the component is imaged with a camera. At the time of imaging, illumination light is irradiated to the surface of the board by an illuminating apparatus, and the camera takes the image of the recognition object by receiving the reflected light from the recognition object. Because the reflection property of reflecting the illumination light varies with the surface property of the recognition object, to clearly identify the recognition object such as a recognition mark and the background of the image, a plurality of illumination light sources are placed at different positions as an illuminating apparatus, and the color tone of the illumination light and the irradiation direction towards the surface of the board can be changed on the basis of the recognition object. Such a structure is known (for example, referring to patent document 1). In the example shown in the patent document 1, a ring illumination light which irradiates to the substrate that is located below from the circumferential direction of the obliquely upward and a coaxial illumination light which irradiates light from the imaging direction are equipped, a luminance data of the ring illumination light and the coaxial illumination light to each recognition object are preliminarily sought as individual illumination condition, to in order that the contrast between the recognition object and the background could become best.

RELATED ART DOCUMENT

Patent Document

Patent document 1: JP-A-2009-182280

SUMMARY OF THE INVENTION

Problems to be Solved by the Invention

In recent years, with the downsizing and multifunctionalization of electronic apparatus, the board on which components are mounted is developed to be downsized and have high mounting density. Therefore, the mounting facilities for such kinds of boards are also downsized, and, the constitutive elements used in various component mounting apparatus are also required to be further downsized. However, when an illuminating apparatus of the above described structure is adopted as an illuminating apparatus of the component mounting apparatus having such a size limitation, because the structure requires a plurality of illumination light sources, the occupied space of the illuminating apparatus may be beyond the limitation permitted in designing the apparatus.

Thus, in the illuminating apparatus for imaging used in the conventional component mounting apparatus, when an illumination light of different irradiation ranges is required to support various recognition objects, it is difficult to reduce the occupied space due to the structure of the light source. There is a problem that the requirement of the component mounting apparatus to be compact cannot be met.

Thus, an object of the invention is to provide a component mounting apparatus, an illuminating apparatus used in imaging in the component mounting apparatus and an illuminating method which can support various recognition objects and can meet the requirement of downsizing by reducing the occupied space.

Means for Solving the Problems

A component mounting apparatus of this invention provides with a component mounting apparatus which performs an operation for mounting a component on a board which is held by a board holding portion, comprising an operation performing mechanism which performs a predetermined operation for mounting the component on the board, an imaging portion which acquires an image of a mark that is provided on the component or a board or an image of the body of the component, an illuminating portion which irradiates an illumination light to the component or the board when the imaging portion images, and a recognition portion which performs a recognition process to recognize the image of the mark or the image of the body of the component, wherein the illuminating portion has a light emitting panel in which a plurality of light emitting portions whose light emission states can be individually changed are orderly arranged, and an light emission control portion which individually controls the light emitting portions to makes the irradiation range of the illumination light irradiated from the light emitting panel to be changed on the basis of the imaging object.

An illuminating apparatus used in imaging of this invention provides with an illuminating apparatus in a component mounting apparatus which performs an operation for mounting a component on a board which is held by a board holding portion and comprises an operation performing mechanism which performs a predetermined operation for mounting the component on the board, an imaging portion which acquires an image of a mark that is provided on the component or the board or an image of a body of the component, and a recognition portion which performs a recognition process to recognize the image of the mark or the body of the component, which irradiates an illumination light to the component or the board when the imaging portion images, comprising a light emitting panel in which a plurality of light emitting portions whose light emission states can be individually changed are orderly arranged, and an light emission control portion which individually controls the light emitting portions to makes the irradiation range of the illumination light irradiated from the light emitting panel to be changed on the basis of the imaging object.

An illuminating method used in a component mounting apparatus of this invention, which performs an operation for mounting a component on a board which is held by a board holding portion and comprising an operation performing mechanism which performs a predetermined operation for mounting the component on the board, an imaging portion which acquires an image of a mark that is provided on the component or the board or the body of the component, and a recognition portion which performs a recognition process to recognize the image of the mark or an image of the body of the component, which irradiates an illumination light to the component or the board when the imaging portion images, in which the irradiation ranges of the illumination light irradiated from a light emitting panel in which a plurality of light emitting portions whose light emission states can be individually changed are orderly arranged, are made to be changed on the basis of the imaging object.

Effects of the Invention

According to the present invention, in the component mounting apparatus which performs an operation for mounting a component on a board held by a board holding portion, when an illumination light is irradiated to the component or the board at the time of imaging with an imaging portion, and when the illumination light is irradiated from a light emitting panel in which a plurality of light emitting portions whose light emission states can be individually changed are orderly arranged, the irradiation range of the illumination light which is irradiated from the respective light emitting portions and the color tone distribution of the illumination light in the light emitting panel are made to be changed on the basis of the imaging object by controlling the light emitting portions individually, so that while the imaging can be made on conditions suitably corresponding to various recognition objects, the requirement of downsizing can be met by reducing the occupied space of the illuminating portion.

BRIEF DESCRIPTION OF THE FIGURES

FIGS. 2 (a) and (b) are figures which illustrate a structure of a board recognition camera of the component loading apparatus of the embodiment of the present invention.

FIGS. 5 (a) to (c) are figures which show irradiation ranges and irradiation shapes of illumination lights used in imaging in the component loading apparatus of the embodiment of the present invention.

FIGS. 6 (a) and (b) are figures which show irradiation ranges and color tone distributions of illumination lights used in imaging in the component loading apparatus of the embodiment of the present invention.

FIGS. 7 (a) to (c) are figures which illustrate a structure of a board recognition camera of the component loading apparatus of one embodiment of the present invention.

EMBODIMENTS OF THE INVENTION

Next, an embodiment of the invention is described with reference to the figures. First, the whole structure of a component loading apparatus 1 is described with reference to FIG. 1. The component loading apparatus 1 is a component mounting apparatus which has a function of performing a component loading operation that is an operation for mounting components on a board which is held by a board holding portion in an electronic component mounting line.

Figure 1:
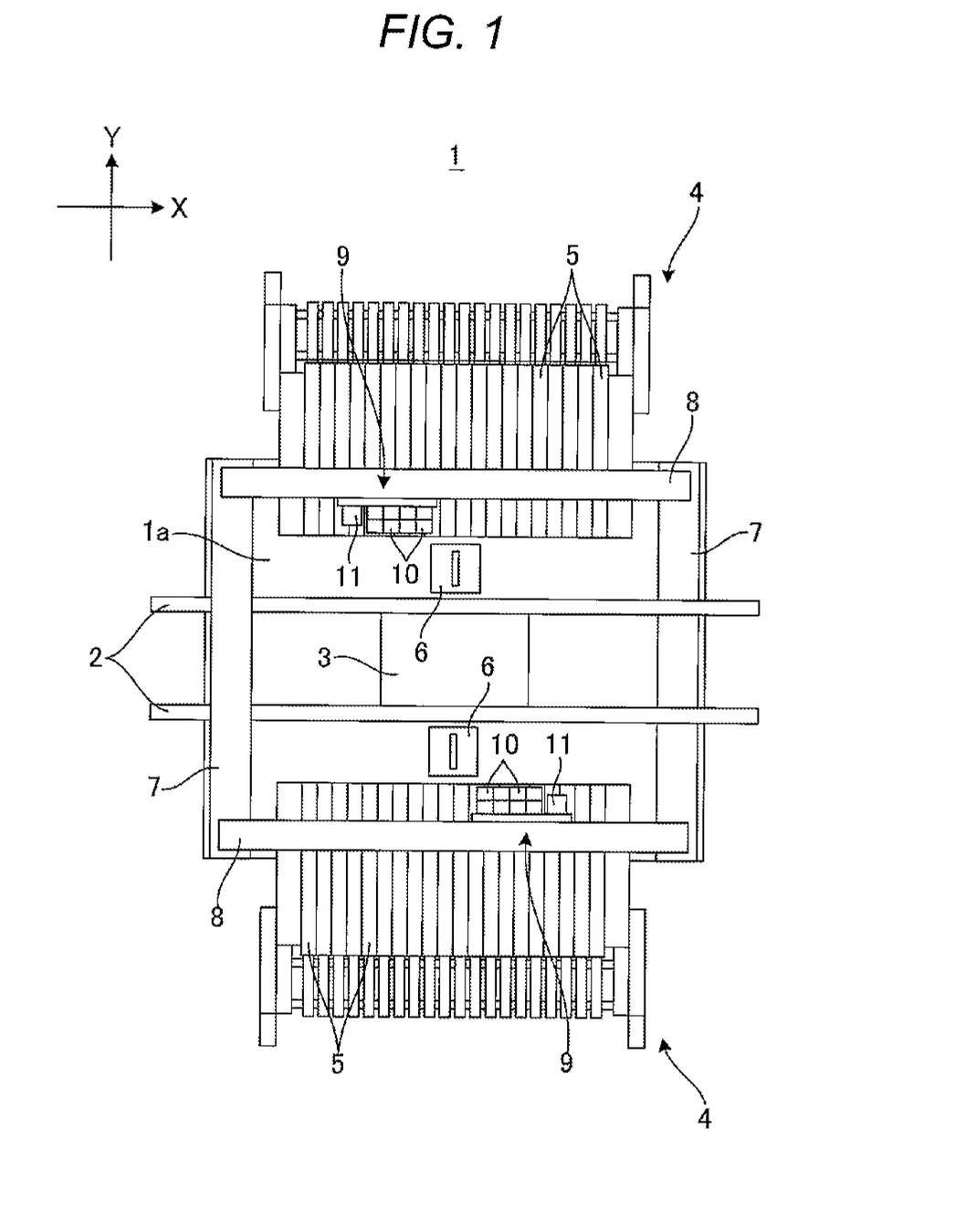
FIG. 1 is a plan view of a component loading apparatus of one embodiment of the present invention.

In FIG. 1, a board conveying portion 2 is disposed at the center of a base 1a in the X direction (board transferring direction). The board conveying portion 2 receives a board 3 that is an operation object from an upstream apparatus. The board 3 is conveyed and positioned to a component mounting operation position by a component mounting portion whose structure will be described below, and is held by a board holding portion. Component supply portions 4 are disposed at both sides of the board conveying portion 2, respectively. A plurality of tape feeders 5 are provided in parallel in the component supply portion 4. The respective tape feeders 5 pitches and forwards carrier tapes which hold components which are objects to be mounted, so that these components are supplied to a pickup position by a loading head 9 to be described below. Between the board conveying portion 2 and the respective component supply portions 4, component recognition cameras 6 are disposed so that the imaging surfaces are directed upwards.

One pair of Y axis movable tables 7 are disposed in the Y direction at both ends of the base 1a in the X direction, and one pair of X axis movable tables 8 are disposed on these Y axis movable tables 7 and are movable in the Y direction. Furthermore, a loading head 9 and a board recognition unit 11 which moves integrally with the loading head 9 are installed on each of the X axis movable tables 8 and are movable in the X direction. The loading head 9 is a multiple units type head which is formed by a plurality of unit transferring heads 10, and a component which is an object to be mounted is held by an adsorbing nozzle (omitted in the figure) which is installed at the lower end of each of the unit transferring heads 10. The loading head 9 horizontally moves in the X direction and in the Y direction when the Y axis movable tables 7 and the X axis movable tables 8 are driven, and components are taken out by the unit transferring heads 10 from the respective component supply portions 4, and transferred and loaded on the board 3 which is positioned and held by the board conveying portion 2. Therefore, the component mounting portion (referring to FIG. 4) which is formed by the Y axis movable tables 7, the X axis movable tables 8 and the loading heads 9, becomes an operation performing mechanism which performs a component loading operation that is a predetermined operation for mounting components on the board 3.

In the above-mentioned component loading operation, the board recognition unit 11 moves onto the board 3 with the movement of the loading head 9, and images recognition objects such as a mark 3a for recognition (referring to FIG. 2) which is formed on the board 3 or a mounted component P which has been mounted. The mark 3a is imaged to recognize the position of the board 3, and the component P is imaged to examine the appearance to determine whether the mounting state is good or not. In the moving path of the loading head 9 between the component supply portion 4 and the board conveying portion 2, the component recognition cameras 6 are disposed so that the imaging surfaces are directed upwards. By moving the loading head 9 to be above the component recognition camera 6 after the component is taken out by the unit transferring head 10 from the component supply portion 4, the component recognition camera 6 images the component which is hold by the unit transferring head 10. In the operation of loading the component on the board 3 performed by the loading head 9, the component loading position is revised on the basis of the board recognition result obtained after the board recognition unit 11 performs a recognition process on imaging data, and the component recognition result obtained after the component recognition cameras 6 performs a recognition process on imaging data.

Figure 2:
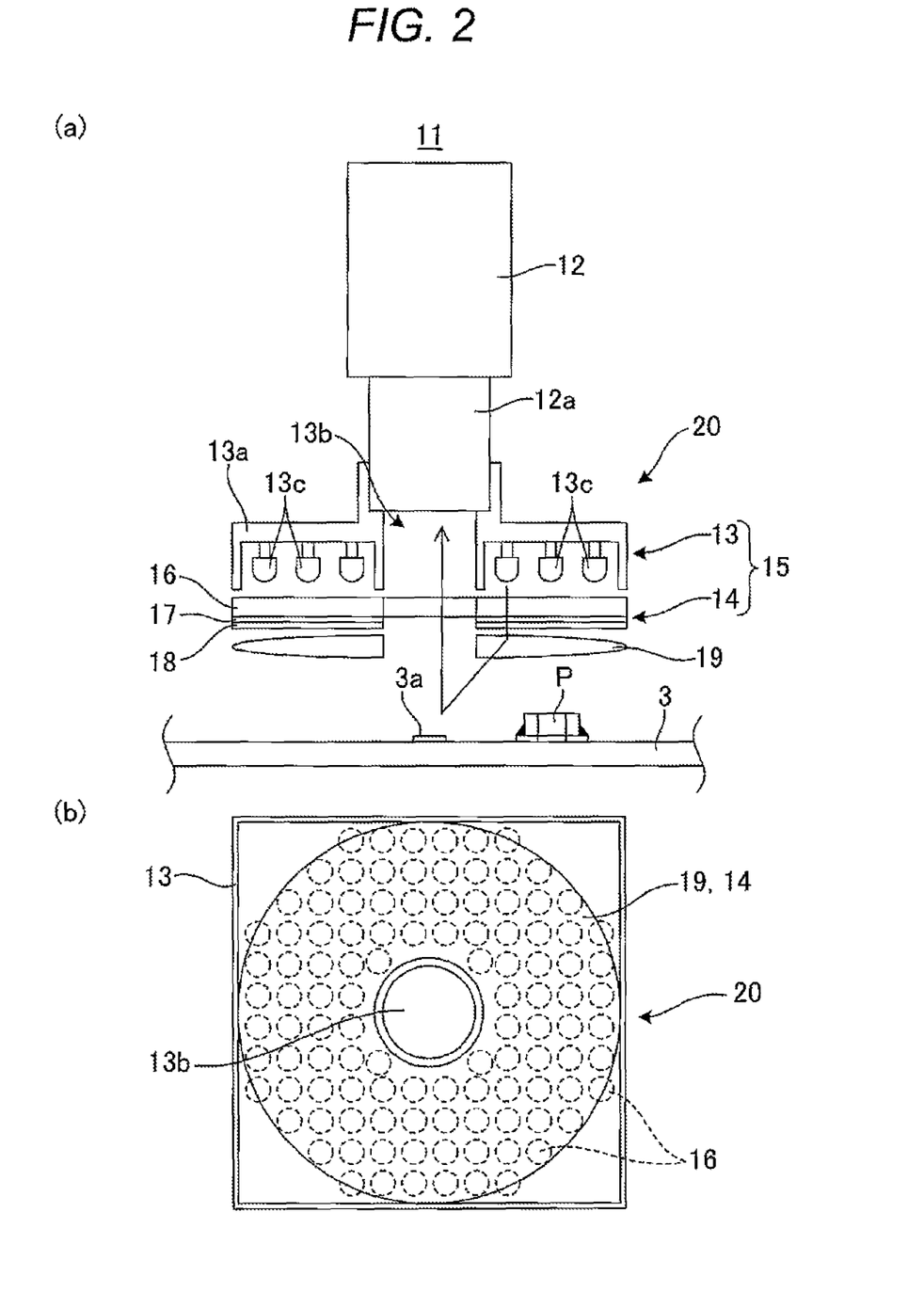

Then, a structure of the board recognition unit 11 is described with reference to (a) and (b) of FIG. 2. In FIG. 2 (a), the board recognition unit 11 includes a board recognition camera 12 whose imaging surface is directed downwards. A light emitting panel 15 which includes a light source portion 13 and a color liquid crystal panel 14 is coupled to an optical system 12a which extends from the board recognition camera 12 downwards, and a condensing lens 19 of an annular shape having a function of condensing an illumination light is installed at the bottom side of the light emitting panel 15. As shown in FIG. 2 (b), the planar shape of the color liquid crystal panel 14 is set to be an annular shape corresponding to the shape of the condensing lens 19. The light source portion 13 is formed by installing a plurality of LED elements 13c that are arranged orderly in a light source box 13a of a rectangular box shape that is opened at the bottom side. An imaging opening portion 13b, through which an imaging light passes, is provided in the central portion of the light source portion 13 and in communication with the optical system 12a.

The light source portion 13 irradiates an illumination light to the color liquid crystal panel 14 by turning on the LED elements 13c, and the color liquid crystal panel 14 makes the illumination light to be transmitted downwards as an illumination light of a desired color tone in a desired irradiation range. The transmitted illumination light is refracted by the condensing lens 19, and is irradiated from all circumferential directions to the mark 3a which is an imaging object. An reflected light of the illumination light passes through the imaging opening portion 13b, and is incident on the board recognition camera 12 through the optical system 12a. Thus, an image of the mark 3a on the board 3 which is the imaging object is acquired.

An example of the light emitting panel 15 used for the board recognition unit 11 which moves integrally with the loading head 9 is shown. Further, a light emitting panel 15 of the same structure can be used for the component recognition camera 6 as an illuminating apparatus when a component held by the loading head 9 or a mark which is provided on the component is imaged. An imaging example for position recognition of the mark 3a formed on the board 3 is shown. However, imaging objects on the board 3 are not limited to this. The light emitting panel 15 can be used when the body of the mounted component P on the board 3 is imaged for the purpose of an appearance examination after the component is mounted.

In other words, the component recognition cameras 6 and the board recognition cameras 12 shown in the embodiment are imaging portions to acquire the image of a mark that is provided on the component P or the board 3, or the body of the component P. The light emitting panel 15 formed by the light source portion 13 and the color liquid crystal panel 14 and the condensing lens 19 forms an illuminating portion which irradiates an illumination light to the component P or to the board 3 when the above-mentioned imaging portions image.

Figure 3:
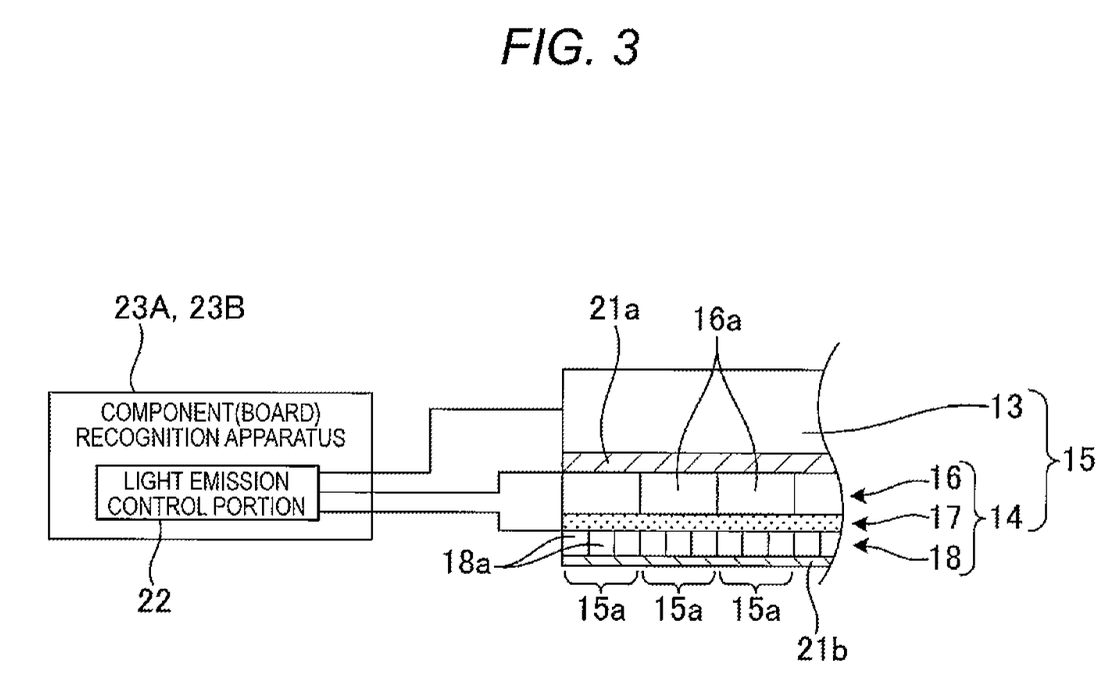
FIG. 3 is a figure which illustrates a structure of a light emitting panel for imaging illumination in the component loading apparatus of the embodiment of the present invention.

Next, a structure of the color liquid crystal panel 14 used for the light emitting panel 15 and the control thereof are described with reference to FIG. 3. In FIG. 3, the color liquid crystal panel 14 is formed by attaching polarization filters 21a and 21b onto both sides of a laminate which is formed by laminating an array board 16, a liquid crystal layer 17 and a color filter board 18. Transparent electrodes (not shown in the figure) are formed in an array form in pixels 16a which are set in the array board 16, and voltages for liquid crystal driving are selectively applied to the respective pixels 16a through the transparent electrodes by a light emission control portion 22. The transmission state of light in the liquid crystal layer 17 is controlled by the respective pixels 16a.

In the color filter board 18, each of the pixels 16a of the array board 16, which is a unit pixel, is further divided into a plurality of sub-pixels 18a which are formed in response to R (red), G (green) and B (blue) that are basic colors. A voltage for color tone setting is applied to each of the sub-pixels 18a through transparent electrodes (not shown in the figure) by the light emission control portion 22. Therefore, the color tone of a light which is transmitted through the liquid crystal layer 17 and passes the color filter board 18, namely, hue, chroma and brightness, can be changed by an R, G and B three color adding and mixing method.

Light is irradiated from the light source portion 13 to the color liquid crystal panel 14 when the light emission control portion 22 makes the light source portion 13 to be turned on. First, the light that passes the polarization filter 21a is transmitted through the liquid crystal layer 17 in a transmission state on the basis of predetermined voltages which are applied to the respective pixels 16 according to an illumination condition the light emission control portion 22 specifies. In the sub-pixels 18a set in response to the respective pixels 16a, voltages are applied to the respective sub-pixels 18a according to a specified illumination condition by the light emission control portion 22. When the transmitted light passes through the color filter board 18, the color tone of the light that passes through the color filter board 18 is controlled by the respective pixels 16a, and the light is transmitted through the polarization filter 21b and is irradiated to an illumination object. Thus, the light emission control portion 22 controls the array board 16 and the color filter board 18 so that the transmission state in which the illumination light from the light source portion 13 is transmitted through the liquid crystal layer 17 and the color tone of the illumination light when the transmitted illumination light passes through the color filter board 18 can be controlled. Therefore, the color tone and the color tone distribution of the illumination light irradiated from the light emitting panel 15 can be set optionally.

In the above structure, individual light emitting divisions 15a, which are defined by dividing the light emitting panel 15 that combines the light source portion 13 and the color liquid crystal panel 14 on the basis of the respective pixels 16a in the array board 16, become light emitting portions whose light emission states can be individually changed by the light emission control portion 22 in the light emitting panel 15. The above-mentioned illuminating portion 20 has the light emitting panel 15 in which the individual light emitting divisions 15a which are a plurality of light emitting portions are orderly arranged with an arranging pattern such as a lattice arrangement, and the light emission control portion 22 which makes the color tone of the illumination light which is irradiated from the respective individual light emitting divisions 15a and the color tone distribution of the illumination light in the light emitting panel 15 to be changed on the basis of an imaging object by individually controlling the individual light emitting divisions 15a. In the embodiment, an example of using a color liquid crystal panel which combines the light source portion 13 and the color liquid crystal panel 14 together as the light emitting panel 15 is shown. However, a structure of using a light emitting panel which does not require a separate light source such as a plasma panel and an organic EL is also possible.

Figure 4:
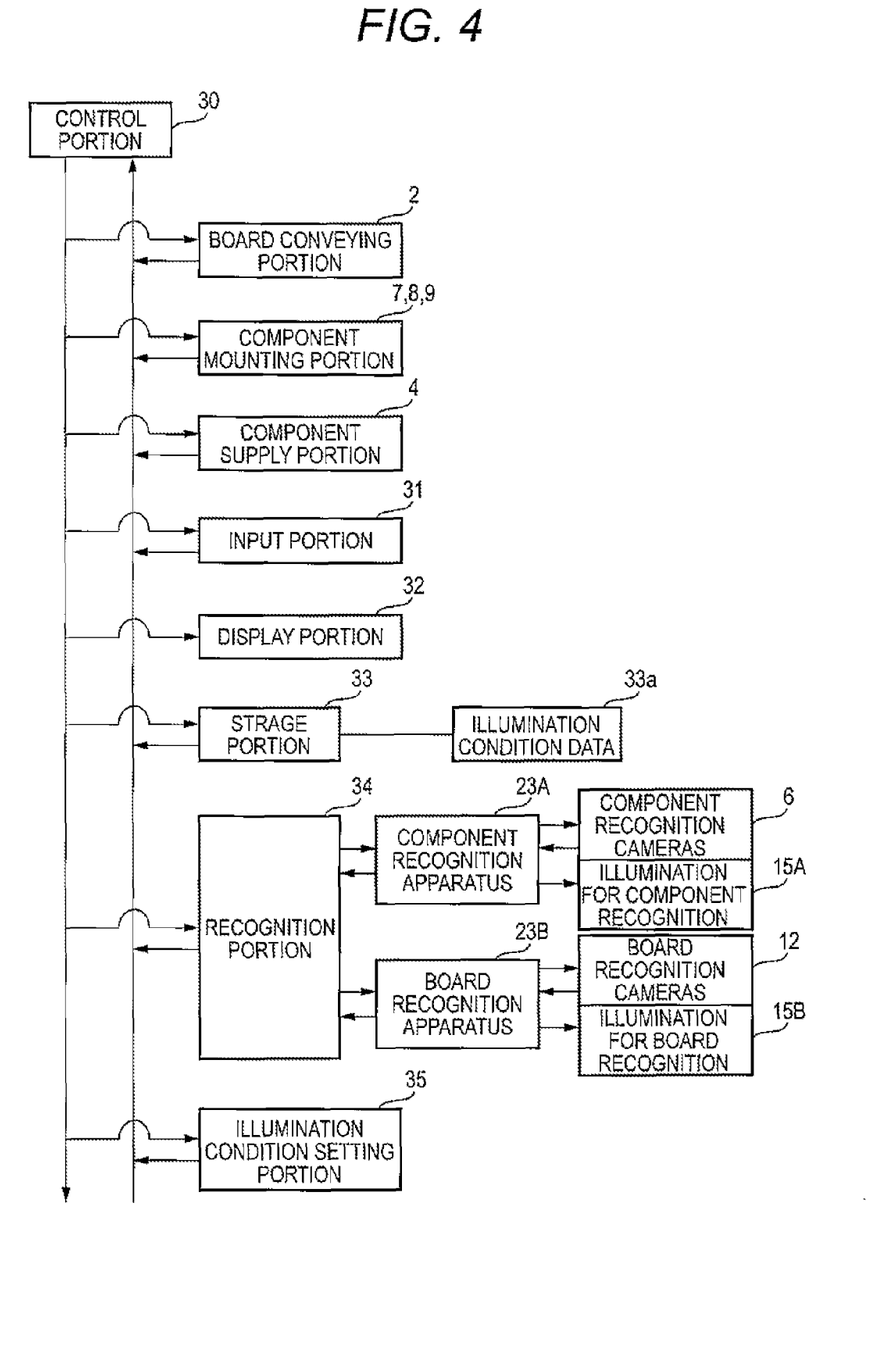
FIG. 4 is a block diagram which shows a structure of a control system of the component loading apparatus of the embodiment of the present invention.

Next, a structure of the control system is described with reference to FIG. 4. In FIG. 4, a control portion 30 performs a component loading operation to mount a component on the board 3 by controlling the board conveying portion 2, a component mounting portion which includes the Y axis movable tables 7, the X axis movable tables 8 and the loading heads 9, and the component supply portion 4. An input portion 31 is an input apparatus such as a keyboard or a touch panel switch, and inputs, for example, an operation command or data for the operation of the component loading apparatus 1. A display portion 32 is a display apparatus such as a liquid crystal display, and displays a screen when the component recognition cameras 6 or the board recognition cameras 12 image or a guide screen when an operation is input. A storage portion 33 stores illumination condition data 33*a* which prescribe illumination conditions when the component recognition cameras 6 or the board recognition cameras 12 image which will be described below, as well as various programs and data necessary for component mounting operations of the component loading apparatus 1.

A recognition portion 34 controls a component recognition apparatus 23A and a board recognition apparatus 23B. The component recognition apparatus 23A makes a component held by the unit transferring head 10 to be imaged by controlling the component recognition camera 6, and at the same time performs a process to make an illumination light to be irradiated at the time of imaging by controlling an illumination for component recognition (the light emitting panel) 15A which is included in the component recognition camera 6. The board recognition apparatus 23B makes a mark 3*a* for recognition which is formed on the board 3 to be imaged by controlling the board recognition camera 12, and at the same time performs a process to make an illumination light to be irradiated at the time of imaging by controlling an illumination for board recognition (the light emitting panel) 15B which is included in the board recognition camera 12. Image data obtained by the component recognition camera 6 and the board recognition camera 12 are acquired by the component recognition apparatus 23A and the board recognition apparatus 23B, and further handed to the recognition portion 34. The recognition portion 34 performs a recognition process on these image data, namely, the image of the mark 3*a* formed on the component P or the board 3 or the body of the component P. An illumination condition setting portion 35 performs a process to set illumination conditions that are instructed to the light emission control portions 22 of the component recognition apparatus 23A and the board recognition apparatus 23B on the basis of the illumination condition data 33*a* which are stored in the storage portion 33 beforehand depending on the type of boards or components which are imaging objects. The illumination for component recognition 15A is the light emitting panel 15 which combines the light source portion 13 and the color liquid crystal panel 14. Similarly, the illumination for board recognition 15B is the light emitting panel 15 which combines the light source portion 13 and the color liquid crystal panel 14 according to the present embodiment.

Next, in the component loading apparatus 1 shown in the present embodiment, when the component recognition cameras 6 or the board recognition cameras 12 image to acquire the image of a mark 3*a* which is provided on the component P or the board 3 or the body of the component P, some real examples of illuminating methods to irradiate illumination light to the component P or the board 3 are described with reference to FIG. 5 (*a*) to (*c*) and FIGS. 6 (*a*) and (*b*).

Figure 5:
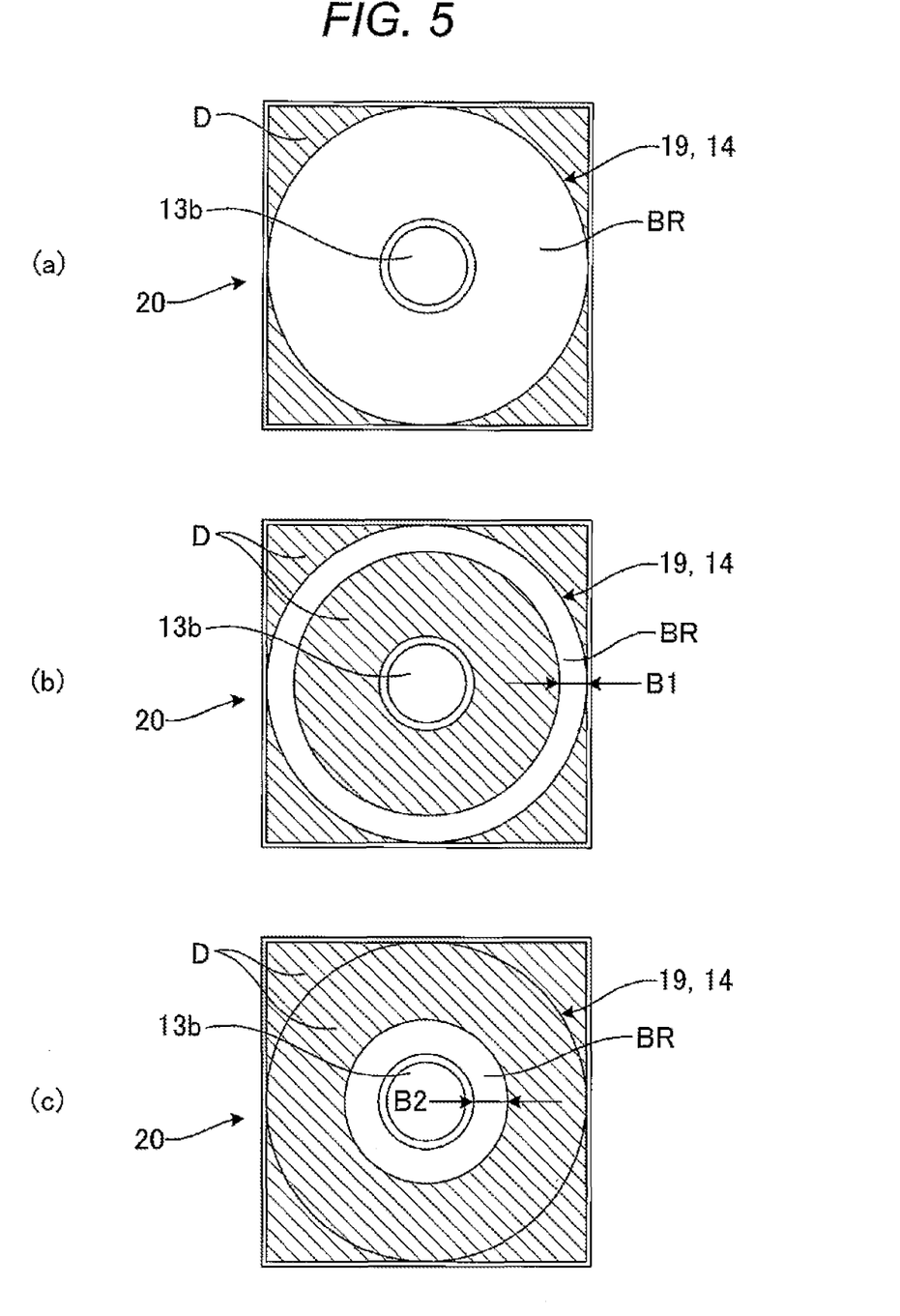

FIGS. 5 (*a*) to 5(*c*) show examples in which the individual light emitting divisions 15*a* in the light emitting panel 15 are individually controlled by the light emission control portion 22 to make the irradiation range of an illumination light irradiated from the light emitting panel 15 to be changed on the basis of the illumination property requested by a board or a component which is an imaging object. First, FIG. 5 (*a*) shows an illumination pattern when a uniform illumination light is irradiated from above in a range as wide as possible to an imaging object. In other word, in this example, a voltage applying pattern is assumed so that all pixels 16*a* of the array board 16 in the color liquid crystal panel 14 makes light from the light source portion 13 to be transmitted through the liquid crystal layer 17. The color tone of the transmitted illumination light in the color filter board 18 is set to be a bright light such as a white light. Therefore, the illumination pattern is realized in which the whole area of the color liquid crystal panel 14 and the condensing lens 19 becomes a bright illumination division BR, and the other area all becomes a dark portion D.

FIG. 5 (*b*) shows an illumination pattern when a so-called ring illumination is performed so that an illumination light is irradiated from above in a cyclic range to an imaging object. In other word, in this example, a voltage applying pattern is assumed so that only those pixels 16*a* in a range of a predetermined width B1 from the circumference in the pixels 16*a* of the array board 16 in the color liquid crystal panel 14 makes light from the light source portion 13 to be transmitted through the liquid crystal layer 17. The color tone of the transmitted illumination light in the color filter board 18 is set to be a bright light such as a white light. Therefore, the ring illumination type illumination pattern is realized in which a cyclic range of a predetermined width B1 from the circumference in the area of the color liquid crystal panel 14 and the condensing lens 19 becomes a bright illumination division BR, and the other area all becomes a dark portion D.

FIG. 5 (*c*) shows an illumination pattern when a so-called coaxial illumination is performed so that an illumination light is irradiated generally vertically from a range near the imaging opening portion 13*b* to surround the imaging optical axis downwards to an imaging object. In other word, in this example, a voltage applying pattern is assumed so that only those pixels 16*a* in a range of a predetermined width B2 from the circumference of the imaging opening portion 13*b* in the pixels 16*a* of the LED elements 13*c* in the color liquid crystal panel 14 makes light from the light source portion 13 to be transmitted through the liquid crystal layer 17. The color tone of the transmitted illumination light in the color filter board 18 is set to be a bright light such as a white light. Therefore, the coaxial illumination type illumination pattern is realized in which a cyclic range of a predetermined width B2 from the circumference of the imaging opening portion 13*b* in the area of the color liquid crystal panel 14 and the condensing lens 19 becomes a bright illumination division BR, and the other area all becomes a dark portion D.

Figure 6:
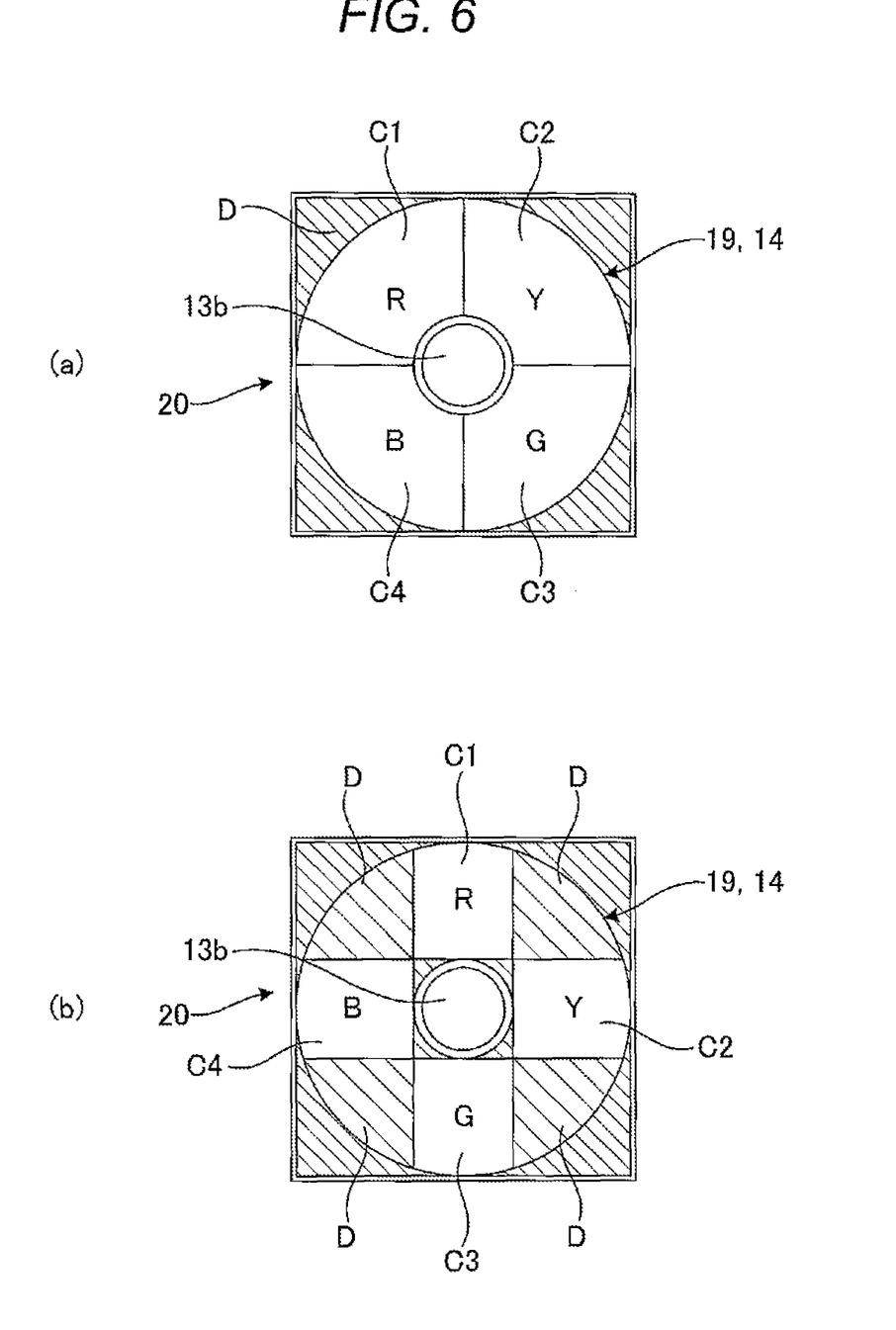

FIGS. 6(*a*) and 6(*b*) show examples in which individual light emitting divisions 15*a* in the light emitting panel 15 are individually controlled by the light emission control portion 22 to make the color tone of the illumination light which is irradiated from the respective individual light emitting divisions 15*a* and the color tone distribution of the illumination light in the light emitting panel 15 to be changed on the basis of the illumination property requested by a board or a component which is an imaging object. First, FIG. 6 (*a*) shows an illumination pattern to irradiate an illumination light of different color tones from different directions to an imaging object. In other words, in this example, the plurality of pixels 16*a* of the LED elements 13*c* in the color liquid crystal panel 14 are divided equally into 4 divisions in point symmetry around the imaging opening portion 13*b*, and the light emitting divisions are respectively used as color light emitting divisions C1, C2, C3 and C4 in which an illumination light of the hue of R (red), Y (yellow), G (green) or B (blue) is irradiated respectively.

Further, an illumination pattern to irradiate an illumination light of different color tones from specific directions to an imaging object is shown in the example shown in FIG. 6 (*b*). In other words, in this example, four light emitting divisions are set in the color liquid crystal panel 14 to form 90 degree with each other around the imaging opening portion 13*b* in the LED elements 13*c*, and these light emitting divisions are respectively used as color light emitting divisions C1, C2, C3 and C4 in which an illumination light of the hue of R (red), Y (yellow), G (green) or B (blue) is irradiated respectively, and the other area all becomes a dark portion D.

In the above-mentioned illuminating method, when an illumination light is irradiated from the light emitting panel 15 in which a plurality of individual light emitting divisions 15a whose light emission state can be changed individually are orderly arranged, the irradiation range and the color tone of the illumination light which is irradiated from the respective light emitting divisions 15a and the color tone distribution of the illumination light in the light emitting panel 15 can be changed on the basis of an imaging object when the light emitting divisions 15a are controlled by the light emission control portion 22. By adopting the above structure, the problem in the illuminating apparatus used in imaging in the conventional component mounting apparatus that illumination lights of different irradiation ranges and different color tones are required to support various recognition objects, namely, the problem that it is difficult to reduce the occupied space due to the structure of the light source, and a component mounting apparatus which is required to be compact can not be provided, can be solved.

It is needless to say that, according to the above structure, it is possible to set various illumination patterns besides the above examples. In other words, in the above structure, because in addition to the transmission state of the illumination light, the color tone of the illumination light, namely, hue, chroma and brightness can be arbitrarily set by the respective individual light emitting divisions 15a, it is possible to choose the irradiation range, the color tone and the color tone distribution of the illumination light on the basis of an imaging object with a big flexibility which is difficult in the conventional art.

Figure 7:
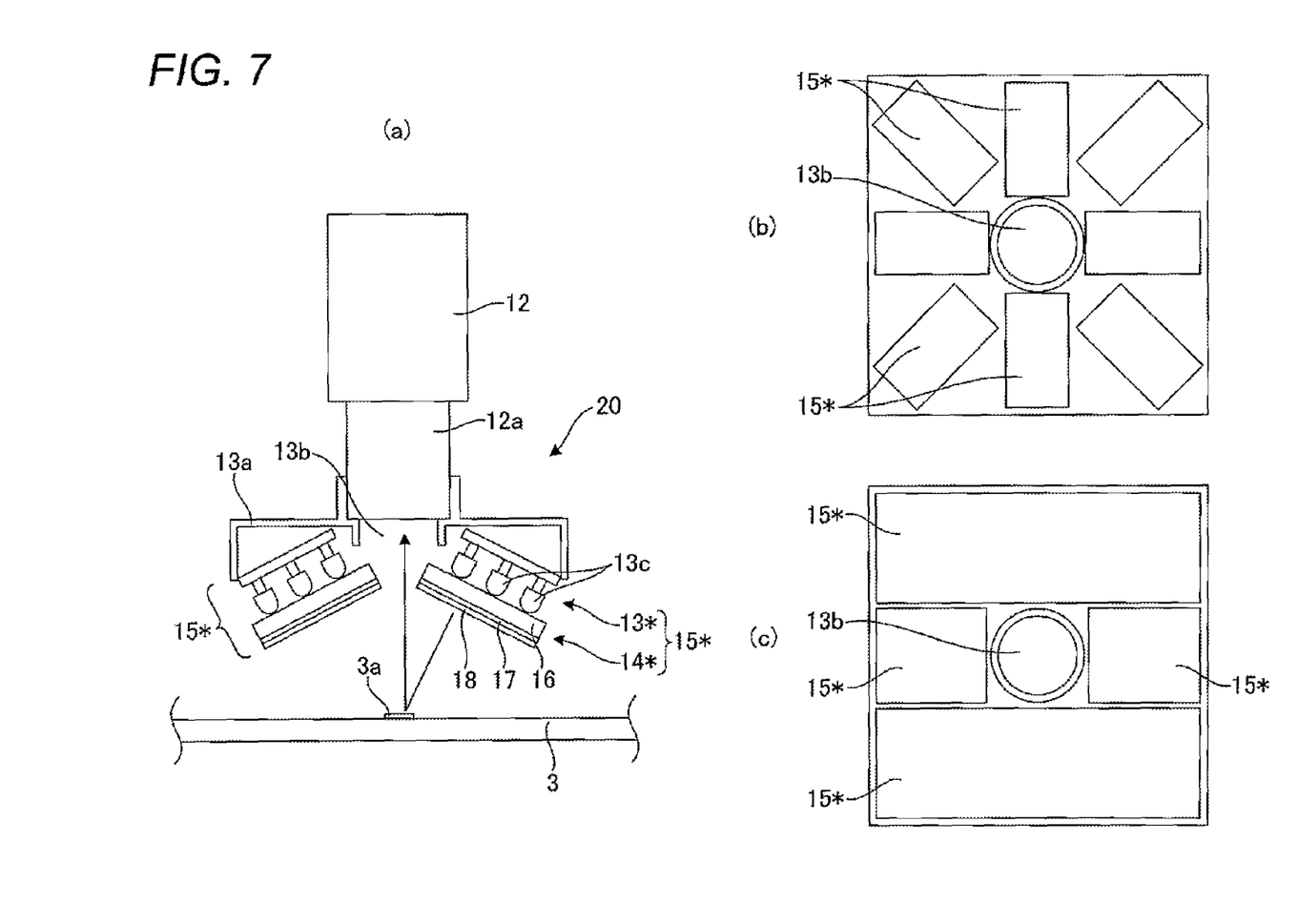

In the illuminating portion 20 of the structure shown in FIG. 2, a structure in which the illumination light irradiated from the light emitting panel 15 is condensed by the condensing lens 19 is shown, but instead of using the condensing lens 19, it is also possible to use a structure as shown in FIG. 7. In other words, in examples shown in FIG. 7, a light emitting panel which combines a light source board 13* in which a plurality of LED elements 13c are arranged and a color liquid crystal panel 14* which is formed by laminating, similarly to the structure of the light emitting panel 15 shown in FIG. 2, an array board 16, a liquid crystal layer 17 and a color filter board 18 is formed as a unit light emitting panel 15* which has a predetermined shape and size, and a plurality of the unit light emitting panels 15* are used in combination. Thus, it becomes unnecessary to use the condensing lens 19 by focusing the illumination lights on an imaging object (here, the mark 3a on the board 3) by obliquely disposing irradiating surfaces of these units light emitting panel 15* towards the imaging object.

Here, in FIG. 7 (b), an example in which a plurality of unit light emitting panels 15* are disposed in a radial form around the imaging opening portion 13b is shown. In FIG. 7 (c), an example in which a plurality of unit light emitting panels 15* of different sizes are disposed in a parallel form around the imaging opening portion 13b is shown. With these structures, the same effect as the structure example shown in FIG. 2 can be obtained.

In the above-described embodiments, the examples in which the light emitting panel 15 is applied to the illumination when the component recognition camera 6 or the board recognition camera 12 in the component loading apparatus images are shown, but the present invention is not limited to the application. The present invention is applicable to various apparatuses in which illumination is required for imaging in the field of component mounting, including imaging for a solder examination or an appearance examination after a component is mounted in a component recognition or screen printing apparatus in a component loading apparatus.

Although the present invention is described in detail with reference to specific embodiments, it is apparent that various modifications and amendments may be made by those skilled in the art without deportioning from the spirit and scope of the invention.

This application is on the basis of the Japanese patent application (patent application 2010-189007) filed on Aug. 26, 2010, whose content is incorporated herein by reference.

INDUSTRIAL APPLICABILITY

The component mounting apparatus and the illuminating apparatus and the illuminating method for imaging of the present invention can support various recognition objects, have an effect of being able to meet the requirement of downsizing by reducing the occupied space, and can be used to examine or recognize components or boards in component mounting apparatus such as component loading apparatus.

DESCRIPTION OF THE SYMBOLS 1 component loading apparatus
3 board
3a mark
6 component recognition camera (imaging portion)
9 loading head
11 board recognition unit
12 board recognition camera (imaging portion)
13 light source portion
14 color liquid crystal panel
15 light emitting panel
15a individual light emitting division (light emitting portion)
16 array board
16a pixel
17 liquid crystal layer
18 color filter board
18a sub-pixel
19 condensing lens
20 illuminating portion
P component

The invention claimed is:

1. A component mounting apparatus which performs an operation for mounting a component on a board which is held by a board holding portion, comprising:
   an operation performing mechanism which performs an operation for mounting the component on the board;
   an imaging portion which captures an image of a mark provided on the component or the board or an image of a body of the component;
   an illuminating portion which irradiates an illumination light to the component or the board when the imaging portion captures the image of the mark or the image of the body of the component; and
   a recognition portion which performs a recognition process to recognize the image of the mark or the image of the body of the component;
   wherein the illuminating portion includes a light emitting panel having a plurality of light emitting portions orderly arranged, and light emission control portion which individually controls the light emitting portions to change an irradiated range of the illumination light irradiated from the light emitting panel in accordance with a type of the mark or the component, wherein a light emission state of each of the plurality of light emitting portions is individually variable.

2. The component mounting apparatus according to claim 1, wherein changing the irradiated range of the illumination light provides a plurality of illumination patterns of different irradiated areas and different non-irradiated areas.

3. An illuminating apparatus used in imaging, which performs an operation for mounting a component on a board held by a board holding portion, comprising:
   an operation performing mechanism which performs an operation for mounting the component on the board;
   an imaging portion which captures an image of a mark provided on the component or the board or an image of a body of the component;
   a recognition portion which performs a recognition process to recognize the image of the mark or the image of the body of the component, which irradiates an illumination light to the component or the board when the imaging portion captures the image of the mark or the image of the body of the component; and
   a light emitting panel having a plurality of light emitting portions orderly arranged, and light emission control portion which individually controls the light emitting portions to change an irradiated range of the illumination light irradiated from the light emitting panel in accordance with a type of the mark or the component, wherein a light emission state of each of the plurality of light emitting portions is individually variable.

4. The illuminating apparatus according to claim 3, wherein changing the irradiated range of the illumination light provides a plurality of illumination patterns of different irradiated areas and different non-irradiated areas.

5. An illuminating method used in a component mounting apparatus which performs an operation for mounting a component on a board which is held by a board holding portion and comprising an operation performing mechanism which performs an operation for mounting the component on the board, an imaging portion which captures an image of a mark that is provided on the component or the board or an image of a body of the component, and a recognition portion which performs a recognition process to recognize the image of the mark or the body of the component, which irradiates an illumination light to the component or the board when the imaging portion captures the image of the mark or the image of the body of the component, comprising
   changing an irradiated ranges of the illumination light irradiated from a light emitting panel having a plurality of light emitting portions orderly arranged in accordance with a type of the mark or the component, wherein a light emission state of each of the plurality of light emitting portions is individually variable.

6. The illuminating method according to claim 5, wherein changing the irradiated range of the illumination light provides a plurality of illumination patterns of different irradiated areas and different non-irradiated areas.

* * * * *